United States Patent
Pham et al.

(10) Patent No.: US 9,494,125 B2
(45) Date of Patent: Nov. 15, 2016

(54) SYSTEM AND METHOD OF IGNITION COIL TESTING

(71) Applicant: Innova Electronics, Inc., Irvine, CA (US)

(72) Inventors: Phuong Pham, Fountain Valley, CA (US); Doug Constable, Lake Forest, CA (US); John Protti, Long Beach, CA (US)

(73) Assignee: Innova Electronics, Inc., Irvine, CA (US)

( * ) Notice: Subject to any disclaimer, the term of this patent is extended or adjusted under 35 U.S.C. 154(b) by 335 days.

(21) Appl. No.: 14/304,510

(22) Filed: Jun. 13, 2014

(65) Prior Publication Data
US 2015/0361946 A1 Dec. 17, 2015

(51) Int. Cl.
*F02P 17/00* (2006.01)
*F02P 17/12* (2006.01)
*G01R 31/06* (2006.01)
*H01F 7/18* (2006.01)

(52) U.S. Cl.
CPC ............. *F02P 17/12* (2013.01); *G01R 31/06* (2013.01); *H01F 7/1844* (2013.01); *F02P 2017/121* (2013.01)

(58) Field of Classification Search
CPC .... G01R 31/06; G01R 15/16; G01R 31/006; H01L 29/739; H01L 29/1095
USPC ....... 324/323, 338, 380–384, 378, 402, 500, 324/502, 169, 160
See application file for complete search history.

(56) References Cited

U.S. PATENT DOCUMENTS

| | | | |
|---|---|---|---|
| D334,560 S | 4/1993 | Wilson | |
| 5,207,540 A * | 5/1993 | Baldini | B21D 19/005 144/134.1 |
| 5,250,935 A * | 10/1993 | Jonker | F02P 17/08 324/379 |
| 5,347,211 A | 9/1994 | Jakubowski | |
| D377,622 S | 1/1997 | Chen | |
| 5,635,841 A | 6/1997 | Taylor | |
| 5,758,300 A | 5/1998 | Abe | |
| 5,767,681 A | 6/1998 | Huang | |
| 5,809,437 A | 9/1998 | Breed | |

(Continued)

FOREIGN PATENT DOCUMENTS

WO WO 0186576 11/2001

*Primary Examiner* — Melissa Koval
*Assistant Examiner* — Trung Nguyen
(74) *Attorney, Agent, or Firm* — Stetina Brunda Garred & Brucker

(57) ABSTRACT

An ignition coil tester for testing an ignition coil having primary and secondary circuits. The tester includes a cable connector including a primary circuit connector and a secondary circuit connector electrically connectable to the ignition coil. The tester further includes an electronic ignition control module electrically coupled to the primary and secondary circuit connectors and configured to generate ignition coil testing signals for communication to the ignition coil via the primary and secondary circuit connectors The electronic ignition control module is further configured to monitor the connection between the primary circuit connector and the primary circuit of the ignition coil and the connection between the secondary circuit connector and the secondary circuit of the ignition coil, and cease communication of the ignition coil testing signals when the primary circuit connector or secondary circuit connector are not connected to the respective ones of the primary and secondary circuits.

12 Claims, 13 Drawing Sheets

(56) References Cited

U.S. PATENT DOCUMENTS

| | | |
|---|---|---|
| 5,859,628 A | 1/1999 | Ross et al. |
| 5,884,202 A | 3/1999 | Arjomand |
| 6,000,413 A | 12/1999 | Chen |
| 6,055,468 A | 4/2000 | Kaman et al. |
| 6,094,609 A | 7/2000 | Arjomand |
| 6,169,943 B1 | 1/2001 | Simon et al. |
| 6,225,898 B1 | 5/2001 | Kamiya et al. |
| 6,263,268 B1 | 7/2001 | Nathanson |
| 6,389,337 B1 | 5/2002 | Kolls |
| 6,438,471 B1 | 8/2002 | Katagishi et al. |
| 6,499,385 B2 | 12/2002 | Protti |
| 6,535,112 B1 | 3/2003 | Rothshink |
| 6,587,768 B2 | 7/2003 | Chene et al. |
| 6,611,740 B2 | 8/2003 | Lowrey et al. |
| 6,650,318 B1 | 11/2003 | Arnon |
| 6,718,425 B1 | 4/2004 | Pajakowski et al. |
| 6,732,031 B1 | 5/2004 | Lightner et al. |
| 6,807,469 B2 | 10/2004 | Funkhouser et al. |
| 6,836,708 B2 | 12/2004 | Tripathi |
| 6,847,916 B1 | 1/2005 | Ying |
| 6,868,369 B2 | 3/2005 | Huang |
| 6,925,368 B2 | 8/2005 | Funkhouser et al. |
| 6,940,270 B2 | 9/2005 | Chen |
| D510,287 S | 10/2005 | Chen |
| 6,957,133 B1 | 10/2005 | Hunt et al. |
| 6,968,733 B2 | 11/2005 | Andreasen |
| 7,030,742 B2 | 4/2006 | Treadway |
| 7,085,680 B2 | 8/2006 | Huang |
| 7,116,216 B2 | 10/2006 | Andreasen |
| 7,209,813 B2 | 4/2007 | Namaky |
| RE39,619 E | 5/2007 | Andreasen |
| D545,223 S | 6/2007 | Chen |
| D558,621 S | 1/2008 | Rich |
| D559,137 S | 1/2008 | Protti |
| D560,129 S | 1/2008 | Rich |
| D560,527 S | 1/2008 | Rich |
| 7,325,775 B2 | 2/2008 | Chen |
| D563,249 S | 3/2008 | Chen |
| 7,363,149 B2 | 4/2008 | Klausner et al. |
| D569,280 S | 5/2008 | Chen |
| 7,376,497 B2 | 5/2008 | Chen |
| D571,241 S | 6/2008 | Andreasen |
| 7,437,227 B2 | 10/2008 | Andreasen |
| D581,822 S | 12/2008 | Madison |
| 7,464,000 B2 | 12/2008 | Huang |
| D590,387 S | 4/2009 | Chen |
| 7,520,668 B2 | 4/2009 | Chen |
| RE40,798 E | 6/2009 | Chen |
| RE40,799 E | 6/2009 | Chen |
| 7,603,293 B2 | 10/2009 | Chen |
| D610,586 S | 2/2010 | Chen |
| 7,734,390 B2 | 6/2010 | Chen |
| 7,778,750 B2 | 8/2010 | Knight et al. |
| D624,446 S | 9/2010 | Chen |
| D624,838 S | 10/2010 | Chen |
| D625,209 S | 10/2010 | Chen |
| D625,210 S | 10/2010 | Chen |
| D625,634 S | 10/2010 | Chen |
| 7,904,219 B1 | 3/2011 | Lowrey et al. |
| 7,974,750 B2 | 7/2011 | Namaky |
| 8,019,503 B2 | 9/2011 | Andreasen |
| 8,024,083 B2 | 9/2011 | Chen |
| D646,188 S | 10/2011 | Chen |
| D646,599 S | 10/2011 | Chen |
| 8,032,419 B2 | 10/2011 | Chen |
| 8,068,951 B2 | 11/2011 | Chen et al. |
| 8,301,329 B2 | 10/2012 | Andreasen |
| 8,306,687 B2 | 11/2012 | Chen |
| 8,370,018 B2 | 2/2013 | Andreasen et al. |
| 8,630,765 B2 | 1/2014 | Chen |
| 2003/0171111 A1 | 9/2003 | Clark |
| 2004/0110472 A1 | 6/2004 | Witkowski |
| 2005/0200361 A1* | 9/2005 | Bumen ............... H01F 38/12 324/378 |
| 2009/0276115 A1 | 11/2009 | Chen |
| 2011/0224866 A1 | 9/2011 | Chen |
| 2011/0264322 A1 | 10/2011 | Chen |
| 2012/0010775 A1 | 1/2012 | Chen |
| 2012/0081123 A1* | 4/2012 | Thompson ............ F02P 17/12 324/379 |
| 2012/0215398 A1 | 8/2012 | Chen |
| 2014/0046800 A1 | 2/2014 | Chen |
| 2014/0052328 A1 | 2/2014 | Nguyen |

* cited by examiner

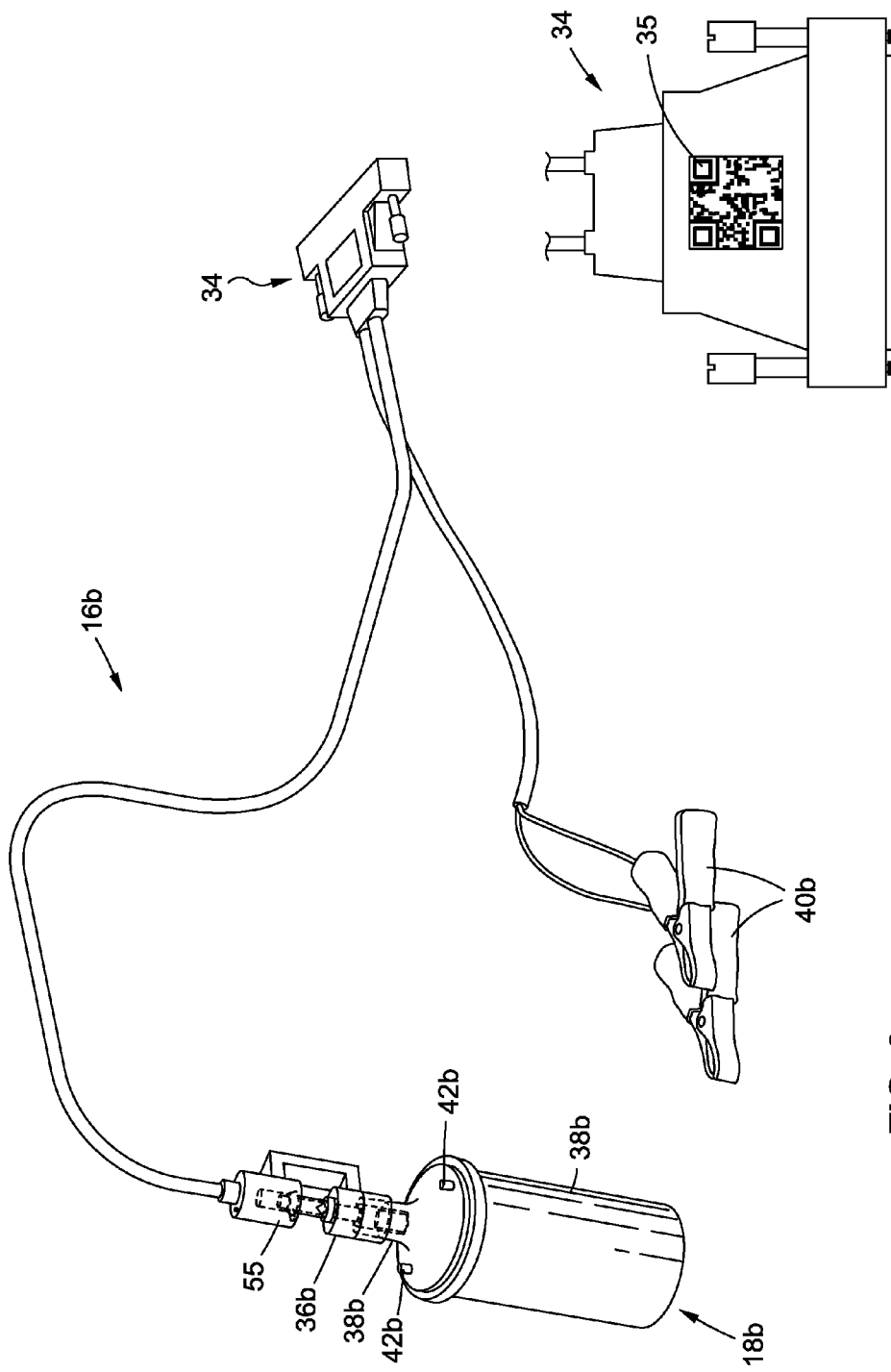

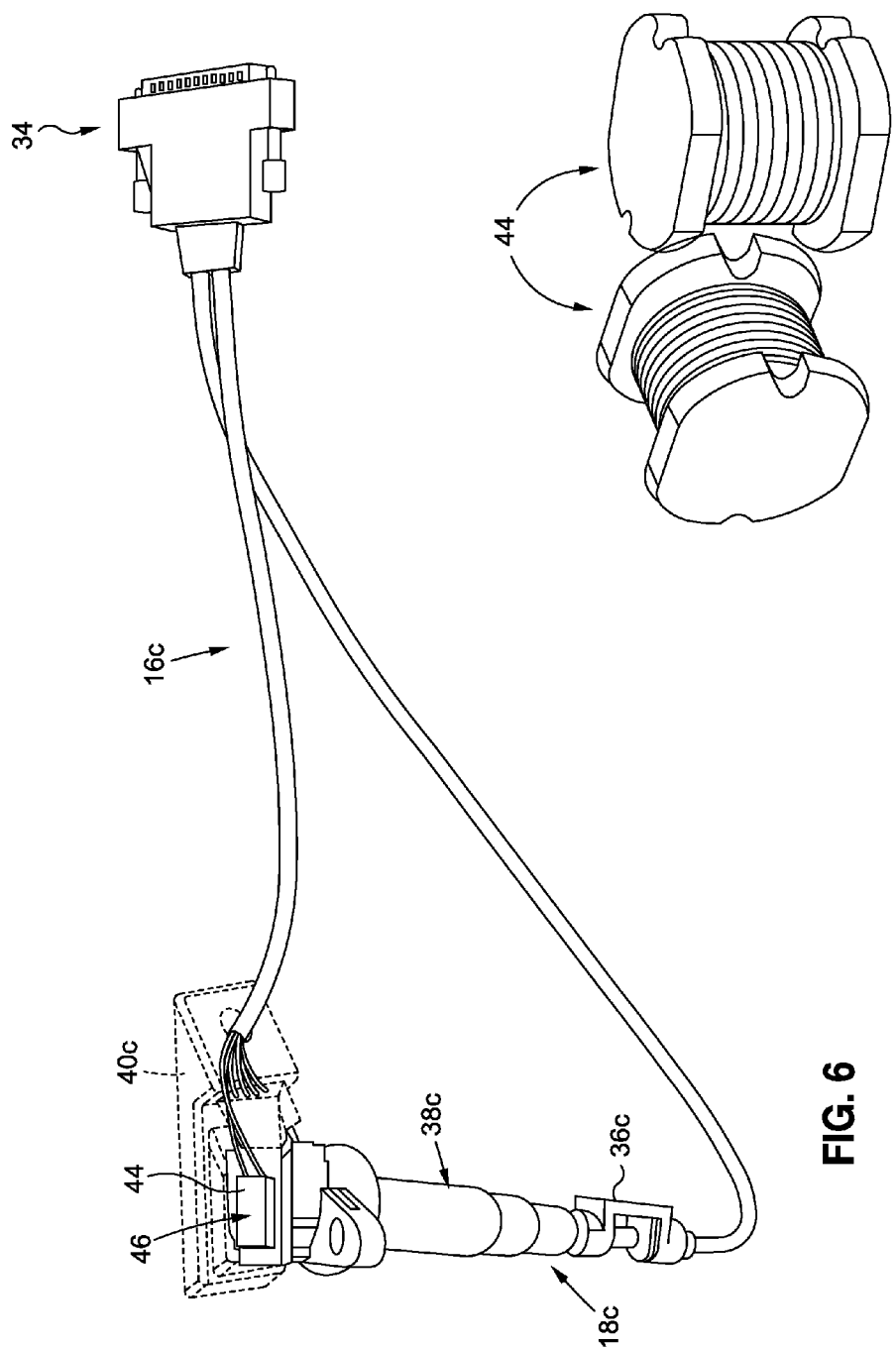

SYSTEM AND METHOD OF IGNITION COIL TESTING

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention generally relates to systems and methods for testing an ignition coil and more particularly, to ignition coil testing systems and methods having enhanced safety features.

Internal combustion engines are widely used to provide the motive force for vehicles. During operation of the internal combustion engine, the combustion of a fuel occurs in a combustion chamber. The combustion produces high-temperature and high-pressure gases which are used as a driving force for the engine. In this respect, the internal combustion engine converts chemical energy into mechanical energy.

In a combustion stroke of an internal combustion engine 4-stroke gasoline engine, the valves are closed and the piston travels upward to compress the air/fuel mixture. At the end of the compression stroke, before the piston reaches the top, the ignition system creates a spark so as to ignite the air-fuel mixture. The mixture explodes, driving the piston down and up, which in turn, rotates the crankshaft of the engine.

In most cases, the ignition system includes a spark plug and an ignition coil, which cooperate to produce the spark needed to create the combustion. Over the years, ignition coil configurations have evolved from oil-filled canister configurations, epoxy-filled configurations, e-core configurations, waste spark configurations, with the most recent conventional configuration being a coil-on-plug or "pencil" coil configuration.

Almost all configurations of the ignition coil include three parts, a primary winding, a secondary winding, and a soft-iron core. A magnetic field is created around the soft-iron core when an electric current flows through the primary winding. When the current flowing through hundreds of turns in the primary winding is interrupted, the resulting magnetic field collapses into many thousands of turns in the secondary winding. By "cutting" the magnetic field many thousand times, the secondary winding multiplies or transforms low battery voltage into the voltages needed to create an ignition spark. Most ignition systems require approximately 5-8 amperes of current at 12 volts to produce 7-35 kV of high-intensity spark.

In some ignition coils, a feedback signal is communicated to the Engine Control Module to enable the Engine Control Module to process the information. For instance, the feedback signal may be used to calculate engine speed, perform misfire diagnostics, etc. Depending on the make of the automobile, the feedback signal may be a Tachometer signal, an IGF signal or a CSI signal.

As such, the ignition coil is an integral to the regular operation of the vehicle due to its contribution in creating a spark and providing a feedback signal to the Engine Control Module.

Proper testing of an ignition coil using conventional methods includes relatively complex troubleshooting procedures requiring skill, expensive testing equipment and a substantial amount of time. Such testing typically requires that a technician be adequately trained in the art of electronic troubleshooting and that the technician use sophisticated test equipment.

Consequently, conventional testing techniques do not provide adequate testing procedures. As such, there is a need in the art to provide improved testing systems and methods for verifying the operational capability of an ignition coil.

BRIEF SUMMARY

According to various aspects of the present invention, there is provided an ignition coil testing device and related method that addresses the deficiencies of the prior art. In this respect, an ignition coil tester is provided that is capable of evaluating the working status of the ignition coil. The tester is connected to the ignition coil, such that the tester and the ignition coil define a circuit which simulates the operating conditions of the vehicle. Once connected and the testing procedure is initiated by the user, the tester checks the status of the ignition coil without requiring an expert or other high-end machines.

According to one embodiment, there is provided an ignition coil tester for testing an ignition coil having a primary circuit and a secondary circuit. The ignition coil tester includes a cable connector including a primary circuit connector electrically connectable to the primary circuit of the ignition coil, and a secondary circuit connector electrically connectable to the secondary circuit of the ignition coil. The ignition coil tester further includes an electronic ignition control module electrically coupled to the primary circuit connector and the secondary circuit connector. The electronic ignition control module is configured to generate ignition coil testing signals for communication to the ignition coil via the primary circuit connector and the secondary circuit connector. The electronic ignition control module is further configured to monitor at least one of the connection between the primary circuit connector and the primary circuit of the ignition coil and the connection between the secondary circuit connector and the secondary circuit of the ignition coil, and cease communication of the ignition coil testing signals when the primary circuit connector or secondary circuit connector are not connected to the respective ones of the primary circuit and secondary circuit of the ignition coil.

The primary circuit connector and the secondary circuit connector may collectively define a unique connector ID. The electronic ignition control module may be configured to generate the ignition coil testing signals in accordance with the unique connector ID.

The cable connector may include an air gap. The ignition coil tester may further include a resistor operatively associated with the air gap.

The ignition coil tester may additionally include a magnetic pickup sensor configured to collect a signal from a trigger ignition coil.

The ignition coil tester may also comprise a power supply in electrical communication with the electronic ignition control module.

The electronic ignition control module may be configured to generate ignition coil testing signals associated with multiple RPM speeds. The ignition coil testing signals may be adapted to test current leakage or winding resistance.

According to another embodiment, there is provided a method of testing an ignition coil having a primary circuit and a secondary circuit. The method includes generating ignition coil testing signals for communication to the ignition coil and communicating the generated ignition coil test signals to the ignition coil. The primary circuit connector communicates the ignition coil test signals to the primary circuit and a secondary circuit connector communicates the ignition coil test signals to the secondary circuit. The method further includes monitoring the connection between the primary circuit connector and the primary circuit of the ignition coil and the connection between the secondary circuit connector and the secondary circuit of the ignition coil, and ceasing communication of the ignition coil testing signals when the primary circuit connector or secondary circuit connector are not connected to the respective ones of the primary circuit and secondary circuit of the ignition coil.

The primary circuit connector and secondary circuit connector may collectively define a connector ID. The ignition coil testing signals generated may be dependent upon the connector ID.

The step of generating ignition coil testing signals may include generating testing signals for testing ignition coil performance at multiple speeds, or testing current leakage of the ignition coil, or testing winding resistance of the ignition coil.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 3 is an upper perspective view of a second coil cable coupled to a second ignition coil;

FIG. 4 is a plan view of an adapter cable connector having integrated QR code;

FIG. 5 is a perspective view of a pair of inductors;

FIG. 6 is a perspective view of an ignition coil having a magnetic pickup sensor placed thereon as part of a primary connector depicted in phantom;

DETAILED DESCRIPTION

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

Figure 1:
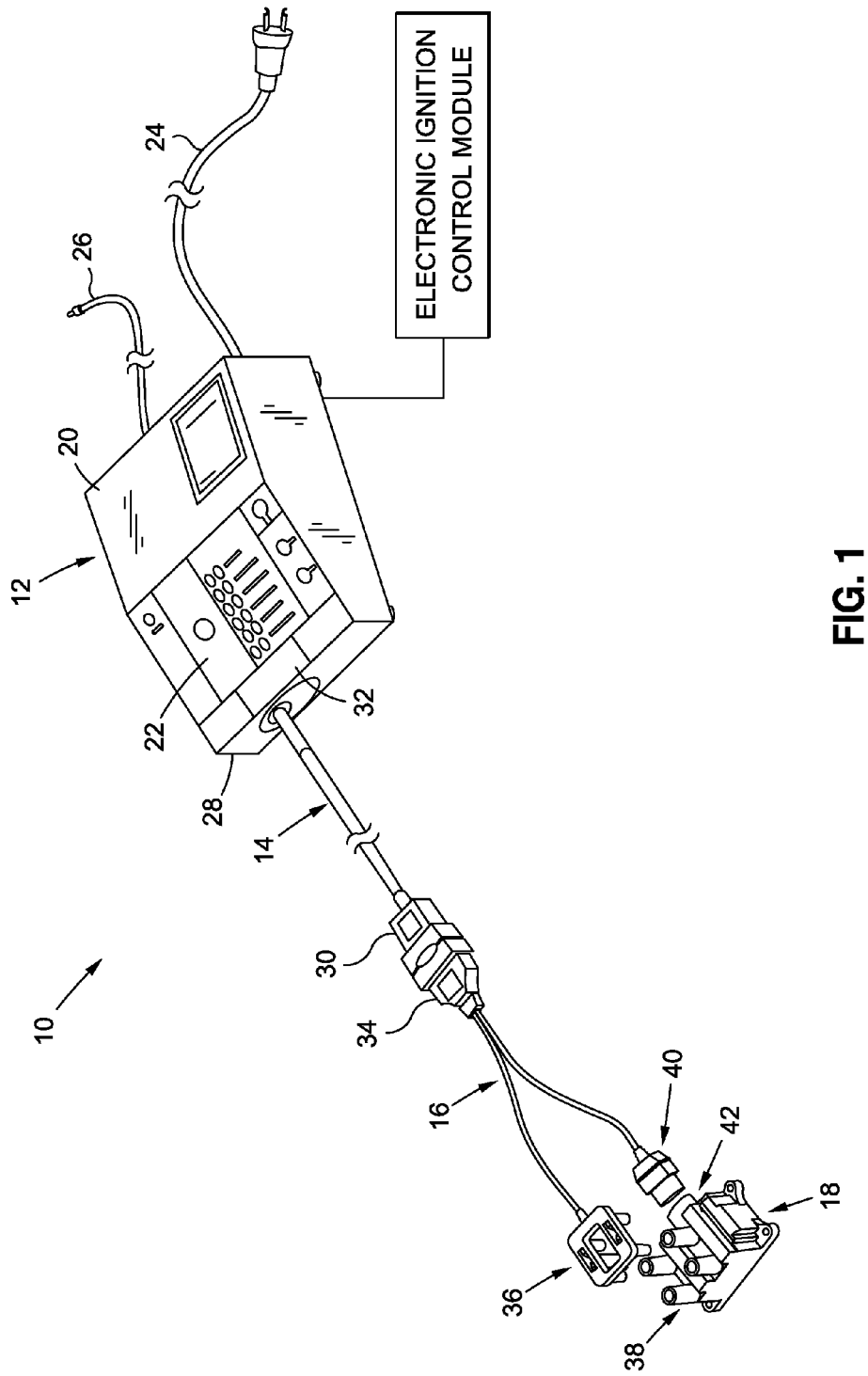
FIG. 1 is an upper perspective view of an ignition coil tester constructed in accordance with an embodiment of the present invention.

Referring now to the drawings, wherein the showings are for the purposes of illustrating a preferred embodiment of the present invention only, and are not for purposes of limiting the same, there is depicted a system and method for testing an ignition coil used in an automobile ignition system. A coil-on-plug (COP) tester 10 is shown in FIG. 1 and is configured to test an ignition coil by checking the electric status and evaluating the working status of the ignition coil in response to certain conditions. The COP tester 10 is designed to integrate the ignition coil into a testing circuit for simulating working conditions similar to those experienced during normal operation of the vehicle. According to one embodiment, the COP tester 10 is capable of performing automated tests on the ignition coil without requiring any expert or any other high-end machine. In one implementation, the tester 10 executes the ignition coil tests while the ignition coil is removed from the vehicle, thereby eliminating the need to swap out the ignition coil for testing. The tester 10 is further configured to ensure that the tester 10 is properly connected to the ignition coil throughout the duration of the test. If the tester 10 detects improper connection or disconnection of the tester 10 from the ignition coil at any point during the test, the tester 10 will stop the test. An improper connection between the tester 10 and the ignition coil may lead to electric shock to the user, and thus, by detecting such improper connection and terminating the test or failing to initiate the test, the tester 10 includes a built-in safeguard.

According to one embodiment, the tester 10 generally includes a control unit 12, an adapter cable 14, and a coil cable 16 that is configured to be connected to the adapter cable 14 and an ignition coil 18.

The control unit 12 includes a housing 20 having a user interface 22 which may include one or more visual indicators, logic indicators (e.g., LED indicators) or audible indicators, as well as a user input. The user input may include control buttons, dials, switches, a touch screen, a microphone or other user inputs known in the art. The processors and memory required for conducting the ignition coil testing as described herein may be located within the housing 20. A power cable 24 may extend from the housing 20 and may be plug connectable to an external power source. Alternatively, a battery may be included within the housing 20 to allow for operation of the tester 10 independent of an external power source. Cable 26 may extend from the housing 20 that may allow the control unit 12 to connect with an external computer (not shown) for enabling bi-directional communication between the control unit 12 and the external computer. It is also understood that the control unit 12 may be capable of communicating with a remote computer via wireless communication means.

The adaptor cable 14 includes a first end connector 28 and an opposing second end connector 30. The first end connector 28 is cooperatively engageable with a complimentary data port 32 formed on the control unit 12, while the second end connector 30 is plug connectable to the coil cable 16, as will be described in more detail below.

The coil cable 16 includes an adaptor cable connector 34 which is plug connectable to the second end connector 30 of the adaptor cable 14. The coil cable 16 further includes a primary circuit connector 40 electrically connectable to the primary circuit 42 of the ignition coil 18, and secondary circuit connector 36 electrically connectable to a secondary circuit 38 of the ignition coil 18.

Figure 2:
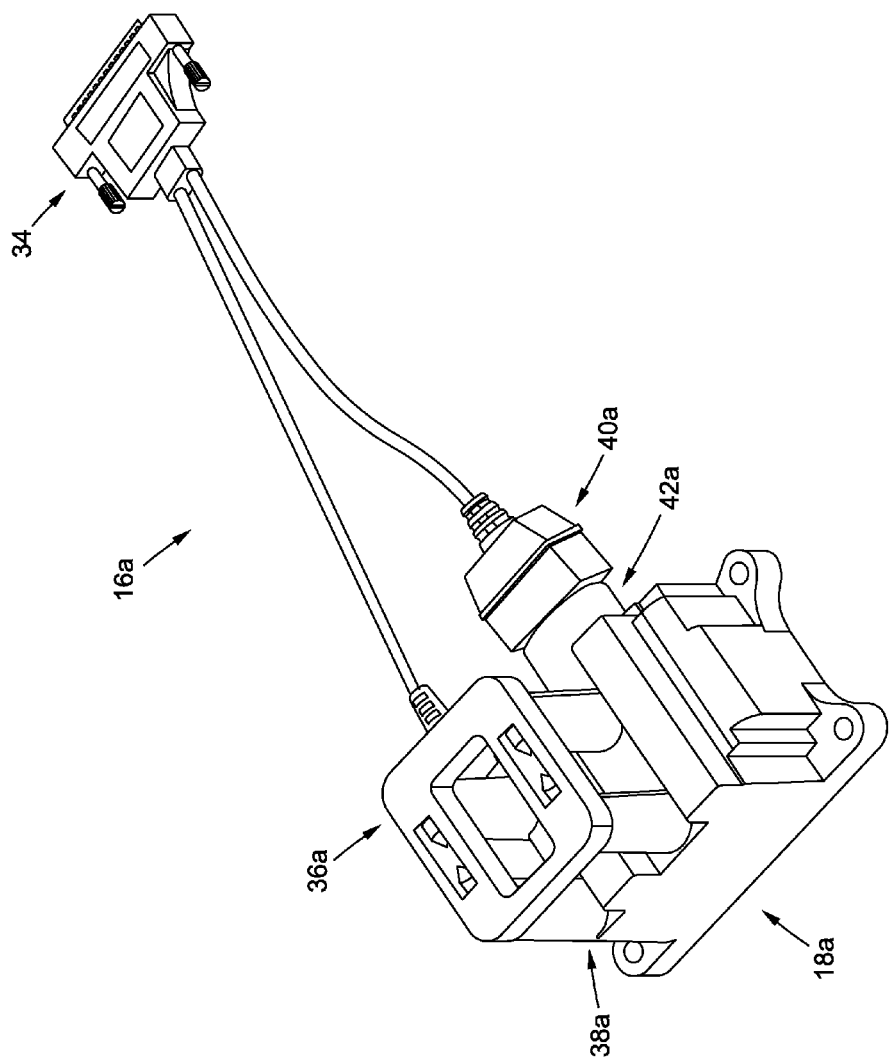
FIG. 2 is an upper perspective view of a first coil cable coupled to a first ignition coil.

Referring now to FIGS. 2 and 3, it is understood that ignition coils 18 may have several different shapes and connector configurations. Therefore, the COP tester 10 is designed to test several ignition coils 18. According to one implementation, the COP tester 10 includes coil cables 16, which are specifically configured and adapted to operatively engage with specific ignition coils 18. For instance, one particular COP testing system utilizes forty-three (43) coil cables 16 for testing forty-five (45) different ignition coils 18 under four (4) main ignition system types: 1) breaker point; 2) electronic ignition; 3) DIS ignition; and 4) coil on-plug ignition. The user selects the specific cable 16 to test the particular ignition coil 18.

FIGS. 2 and 3 are examples of different configurations ignition coils 18 and the corresponding coil cables 16 which may be used therewith. For instance, FIG. 2 depicts an ignition coil 18a having a primary circuit 42a, and a secondary circuit 38a including six (6) connecting posts. The coil cable 16a includes a primary circuit connector 40a which is complementary to the primary circuit 42a and a secondary circuit connector 36a which is complementary to the secondary circuit 38a. FIG. 3 shows an example of a coil cable 16b specifically configured and adapted to engage with ignition coil 18b. In particular, ignition coil 18b includes primary circuit 42b, and a secondary circuit 38b having a pair of connecting posts. The coil cable 16b includes a primary circuit connector 40b specially configured and adapted to engage with the primary circuit 42b, and a secondary circuit connector 36b specifically configured and adapted to engage with the secondary circuit 38b.

Referring now to FIG. 4, there is depicted an embodiment of the adaptor cable connector 34, which according to one embodiment is a D-subminiature connector ("DB connector") which integrates quick response code ("QR code"). The QR code 35 may encrypt information which identifies one or more ignition coil IDs which the coil cable 16 may connect with. The QR code 35 may be read with a hand-held code reader, such as a smart phone, electronic tool, or the like to determine which coil 18 correspond with a particular cable 16. The QR code 35 may be depicted on one or more external surfaces of the adapter cable connector 34. Those skilled in the art will readily appreciate that the connector 34 shown in FIG. 4 is exemplary in nature only, and that other electronic connectors and data encryption techniques known by those skilled in the art may also be used without departing from the spirit and scope of the present invention.

Referring now to FIGS. 5 and 6 one embodiment of the COP tester 10 includes a coil cable 16c having a primary circuit connector 40c and a secondary circuit connector 36c. The coil cable 16c also includes one or more inductors 44 integrated therein for collecting electromagnetic signal from 5-volt trigger ignition coil for collecting an electromagnetic signal from a coil 18c with an integrated igniter. The igniter is a small circuit which receives a command from the Engine Control Unit (ECU) or Powertrain Control Unit (PCU) and drives the coil 18c to create a spark. A coil without an igniter is generally controlled directly by a 12-volt signal from the ECU or PCU, whereas a coil with an igniter works with a 5-volt trigger command from the ECU or PCU. This electromagnetic signal is analyzed and evaluated in peak voltage test and burning time test.

The two inductors 44 are built as a magnetic pick up sensor 46, as shown in FIG. 6. The magnetic pick up sensor 46 may be integrated into the primary circuit connector 40c. The position of the magnetic pick up sensor 46 may affect the test result of the 5-volt trigger ignition coil with igniter. In this respect, the position of the magnetic pick up sensor 46 may be related to the particular configuration of the ignition coil 18. Most coils 18 accept placement of the magnetic pick up sensor above the ignition coil head, near the center, while in other coils 18 such a position is undesirable. By integrating the magnetic pick up connector, the COP tester 10 controls the position of the magnetic pick up sensor 46 at an expected position.

Figure 7:
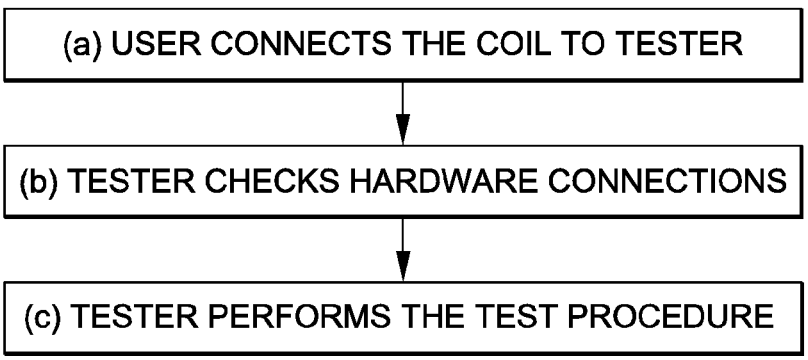
FIG. 7 is an ignition coil testing method in accordance with an embodiment of the present invention.

Referring now to FIG. 7, the COP tester 10 may be used to test an ignition coil 18 by connecting the ignition coil 18 to the tester 10. The tester 10 then checks the hardware connections, particularly, the connection between the primary circuit 42 and primary circuit connector 40, as well as the connection between the secondary circuit 38 and the secondary circuit connector 36. If the tester 10 finds that the connections are sufficient, the tester 10 preforms the test procedure.

Figure 8:
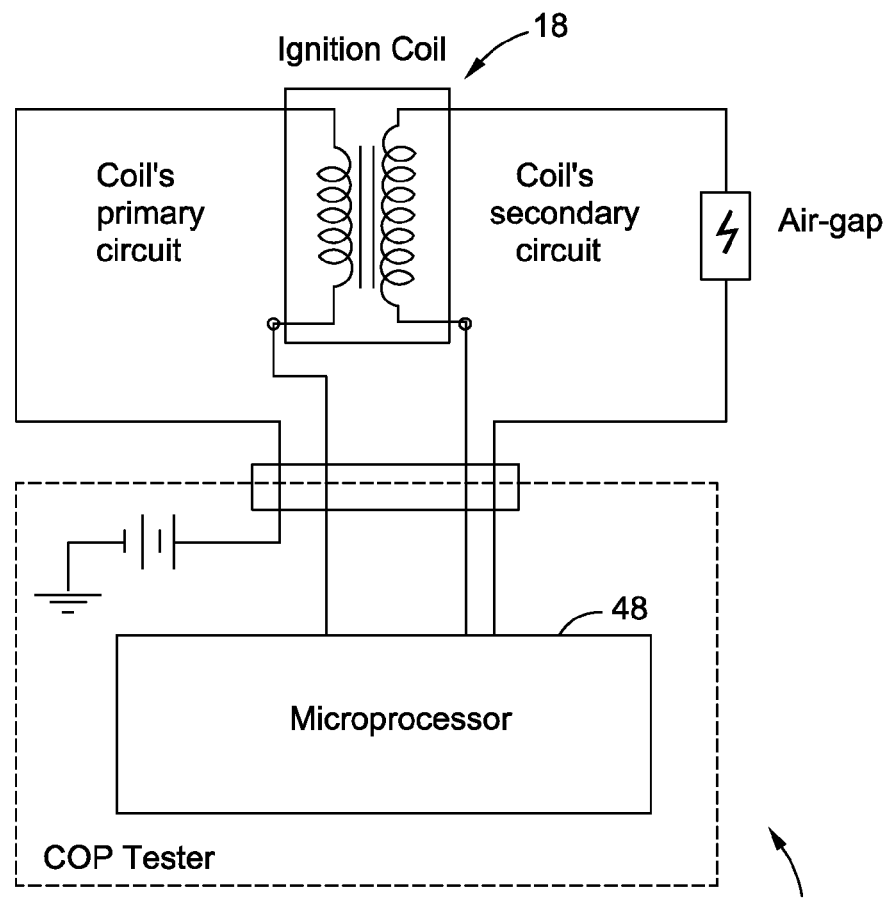
FIG. 8 is a schematic view of a circuit including the ignition coil and the ignition coil tester.

When the user connects the ignition coil 18 to the tester 10, the primary and secondary circuit connectors 40, 36 are placed in electrical communication with the ignition coil 18 to be tested. Since the coil cable 16 is uniquely associated with a particular ignition coil 18, all connectors of the coil cable 16 are connected to ignition coil 18 directly before the test starts. When the tester 10 is properly connected to ignition coil 18, the tester 10 and ignition coil 18 define a testing circuit, as shown in the schematic diagram depicted in FIG. 8.

As described above, the coil cable 16 is placed in electrical communication with the control unit 12 via the adaptor cable 14. The control unit 12 includes an electronic ignition control module 48 which electronically checks whether the primary circuit connector 36 and/or secondary circuit connector 40 are properly connected before testing. If the electronic ignition control module 48 determines that either one of the primary and secondary circuit connectors 36, 40 have become disconnected from ignition coil 18, the electronic ignition control module 48 stops the test. As described herein, the electronic ignition control module 48 conducts testing of the coil 18 under simulated conditions similar to those experienced during normal operation of the vehicle, including a starting mode, an idling mode and a highway/high speed mode.

Referring now back to FIG. 3, one embodiment of the system includes a safety switch 55 to assist in monitoring the connection between the control unit 12 and the ignition coil 18 and terminating a test when the improper testing conditions are detected, e.g., improper connection between the tester and the coil 18. As shown in FIG. 3, the safety switch 55 is integrated into the secondary circuit connector 36 and switches between a first configuration, when conditions are appropriate for testing, and a second configuration, when conditions are inappropriate for testing.

The tester 10 is configured to perform a plurality of tests in multi-speed ranges upon the ignition coil 18. According to one embodiment, the particular tests which are performed are dependent upon the identification of the particular ignition coil 18. The tests are performed by generating ignition coil testing signals at the electronic ignition control module 48 located within the control unit 12 and communicating such testing signals to the ignition coil 18 via the coil cable 16.

Figure 9:
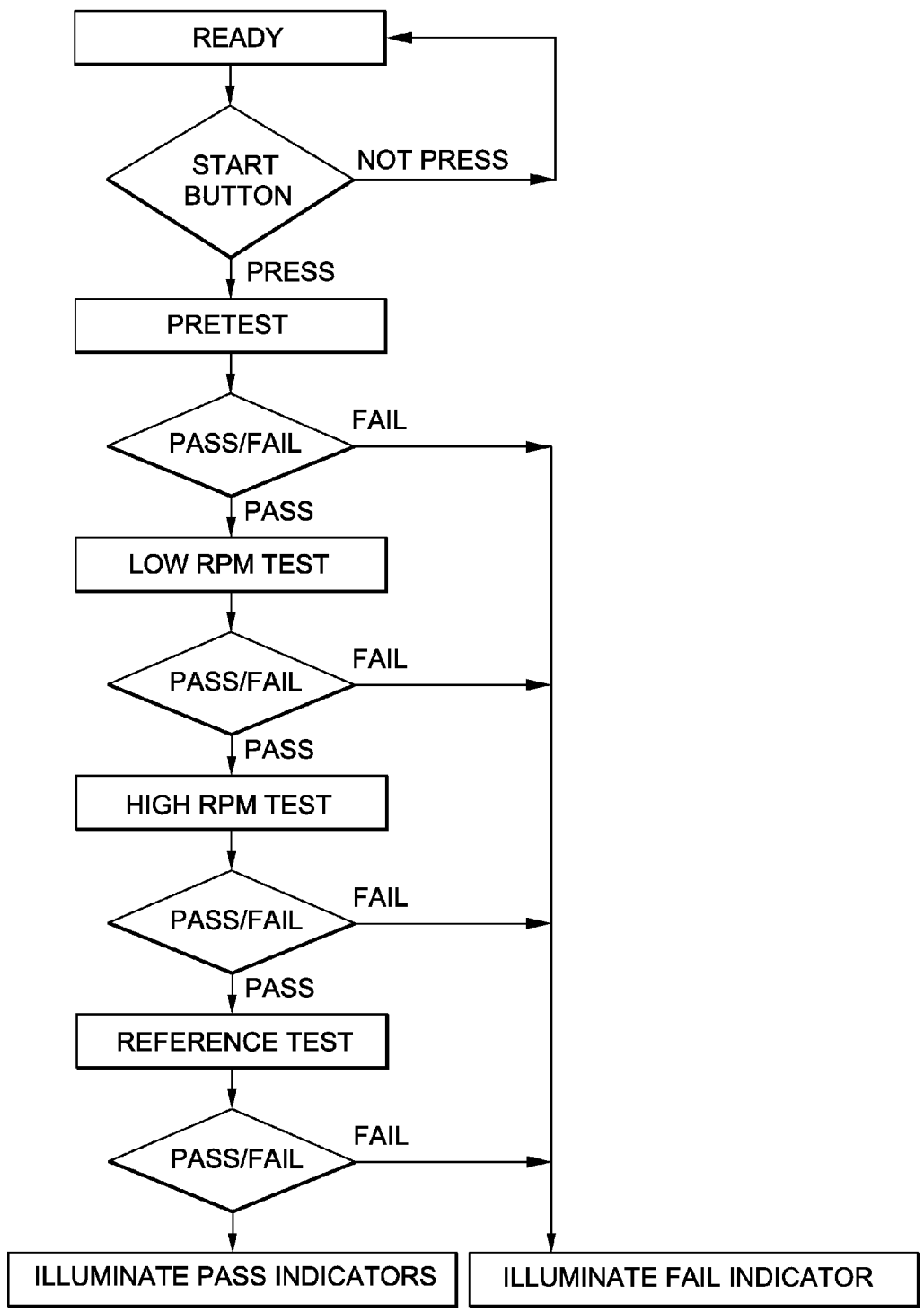
FIG. 9 is one embodiment of an ignition coil testing method.

Referring now to FIG. 9, there is shown a flow chart according to one embodiment for performing a plurality tests upon an ignition coil 18. In this respect, the tester 10 simulates and checks the coil 18 with operation conditions that are the same or substantially equivalent to those conditions experienced during the operation of the vehicle. For instance, engine speed, coil temperature, combustion chamber pressure may be simulated in a given test. The tester 10 preferably checks the primary circuit 38 and secondary circuit 42 to detect almost any coil failure.

The control unit 12 may include a start button which may be pressed by the user to initiate the testing process. When the start button is pressed or actuated, a pretest procedure may be initiated. In one implementation, the pretest procedure includes checking the primary leakage as well as checking the primary winding resistance of the ignition coil. After the pretest has been completed a pass/fail indication is made. Whenever a fail indication is made throughout the testing procedure, a fail indicator light or signal may be actuated. If the pretest procedure results in a PASS, the system progresses into a low RPM test.

During the low RPM test, the tester 10 tests the coil 18 under two ranges of speed, namely, the cranking RPM speed and idle RPM speed. According to one embodiment, the cranking RPM test includes preforming five test cases at a cranking speed, which is about 200 RPM with most coils 18. During the cranking RPM test, the tester 10 checks the primary current trace, the primary break current, the peak voltage, the burning time, and misfire of the ignition coil 18. As to the peak voltage, with 2-wire coils, the tester 10 checks the primary peak voltage, whereas 3-wire coils the tester 10 checks the secondary peak voltage.

The idle RPM test relates to performing five test cases at an idle speed, which may be around 1,000-1,600 RPM depending on the coil 18. In the idle RPM test, the tester 10 checks the primary current trace, the primary break current, the peak voltage, the burning time, and the misfire of the ignition coil 18. As with the cranking RPM test, the peak voltage is tested in two-wire coils by checking the primary peak voltage, and three-wire coils by checking the secondary peak voltage. At the end of the low RPM test, a pass/fail determination is made. If the low RPM tests results in a FAIL, the fail indicator is actuated. Conversely, if the low RPM test results in a PASS, the system progresses to the high RPM test. However, before performing the high RPM test, the tester 10 may preheat the ignition coil 18 by long dwell control mode. The ignition coil 18 is preheated through the conversion of electric energy into electromagnetic energy, which is stored in the coil 18, as well as waste energy, which results in heating of the coil 18. The coil 18 gets hotter to simulate high RPM operation conditions in the vehicle.

According to one embodiment, the high RPM test includes performing five test cases at high RPM speed, which may range from about 3,000-5,000 RPM. The higher RPM test entails checking the primary current trace, the primary break current, the primary peak voltage (which is similar to the low RPM test described above), the burning time and the misfire of the ignition coil 18. At the end of the high RPM test, the tester 10 makes a pass/fail determination.

If the test results in a FIAIL, the fail indicator is actuated, and if the test results in a PASS, the system continues to a reference test.

According to one embodiment, when the tester 10 conducts the low RPM and high RPM tests, the tester 10 performs five test cases. In every test case, the tester 10 simulates the coil trigger signal to control dwell time, which is the time when current flows through the primary winding of the ignition coil. The control unit 12 sends a 5-Volt trigger signal to the trigger circuit or igniter built-in the coil or drive 12-volt coil to ground as dwell time in memory. The control unit 12 then checks the following signals: current trace, break current, peak voltage, burning time and misfire.

Figure 10:
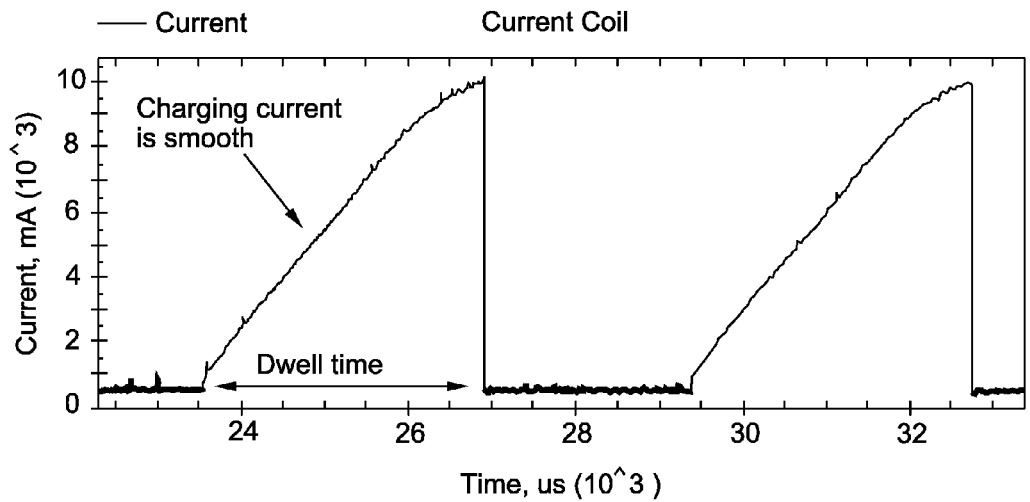
FIG. 10 is a waveform of a good current trace.
Figure 11:
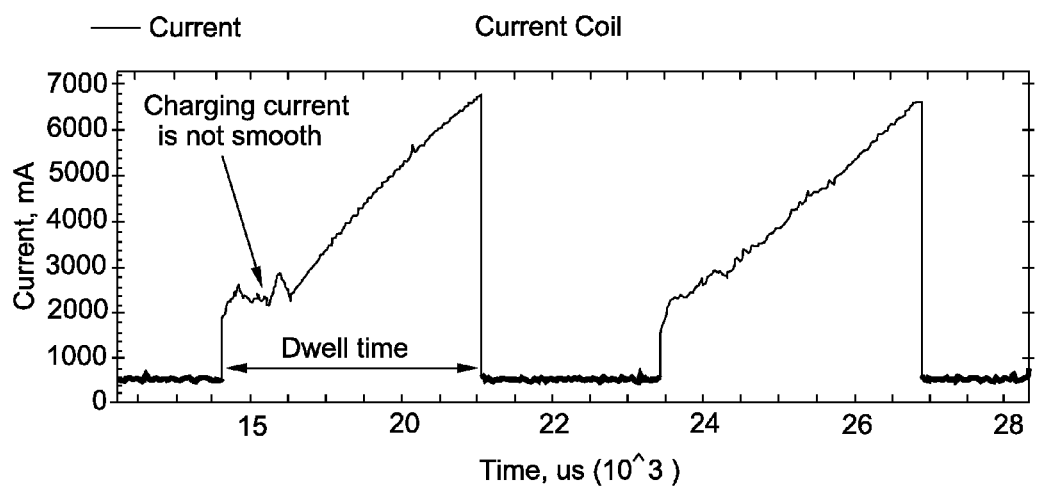
FIG. 11 is a waveform of a bad current trace.

Current trace and break current depict the strength of the ignition coil 18 at the primary winding side. The current trace is the charging current waveform drawn when the current flows through the primary winding. FIG. 10 depicts a waveform that is typical of a desirable current trace, while FIG. 11 depicts a waveform that is typical of an undesirable current trace. The tester 10 analyzes the trace of the charging current and then renders a conclusion. The conclusion is PASS if the charging current is smooth and the conclusion is FAIL if the charging current is not smooth. Various algorithms or programs may be used for determining whether the waveform is sufficiently smooth to achieve a PASS status. The tolerance for evaluating PASS/FAIL may vary from one embodiment to the next.

Figure 12A:
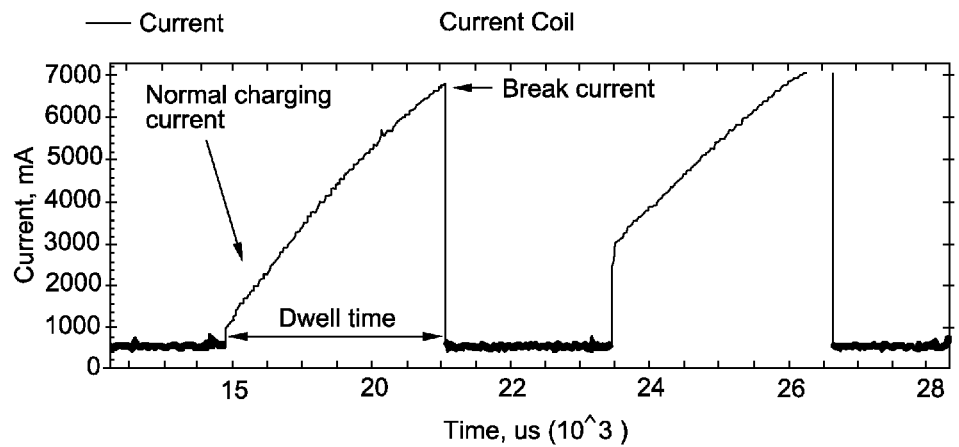
FIGS. 12A and 12B are charging current waveforms.
Figure 12B:
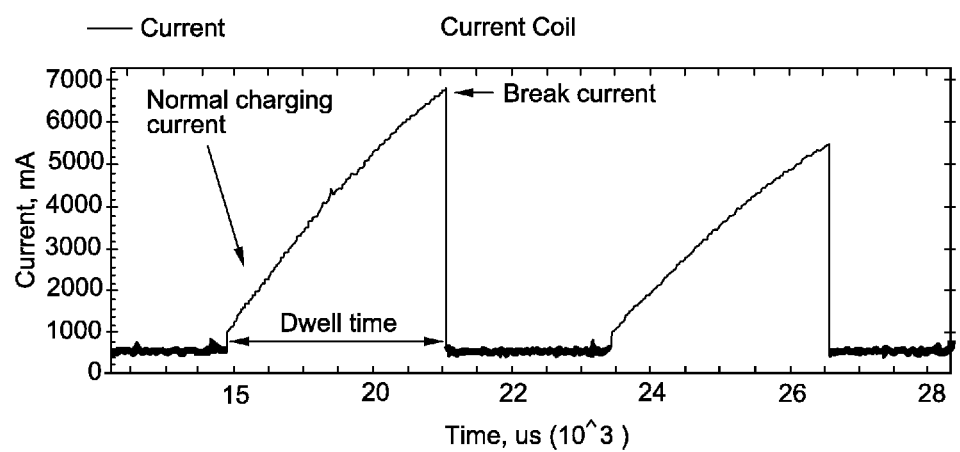

The break current is the maximum charging current value appropriate with every specific dwell time. The break current test case is for diagnosing resistance of the coil 18 at the primary side. If the primary circuit has unwanted resistance, the time for reaching max current will be increased. If the coil is shorted or has lower than normal resistance, the time for the current limit to occur will be reduced. The tester 10 measures the break current and compares it with the specification of the coil and then determines a result. FIGS. 12A and 12B depict an exemplary waveform used for conducting a break current test. In FIG. 12A, the coil is short or has lower than normal resistance, while in FIG. 12B, the coil's resistance is high. The break current test results in a PASS status if the current value meets the specifications of the coil, and a FAIL status if the current value does not meet the specifications.

Figure 13:
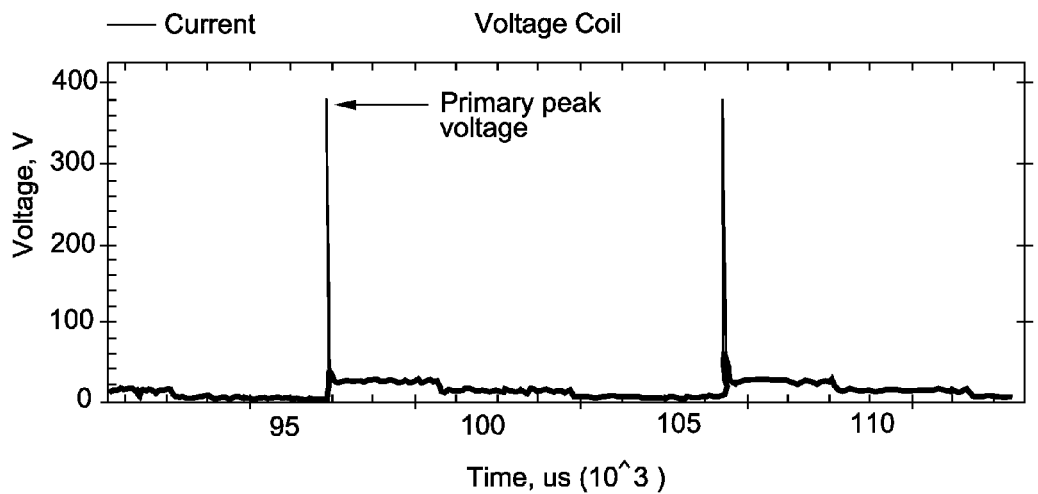
FIG. 13 is a primary voltage waveform.
Figure 14:
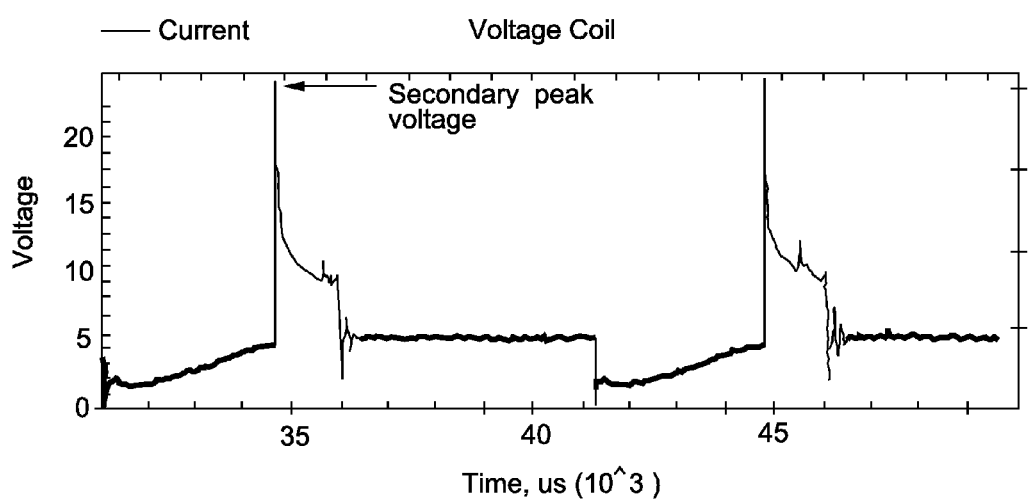
FIG. 14 is a secondary voltage waveform.

The peak voltage test depends on whether the coil is a 2-wire coil or a 3-wire coil. In the case of a 2-wire coil, the tester measures the primary peak voltage by monitoring the primary voltage waveform. FIG. 13 shows the primary voltage waveform used for a peak voltage test. In the case of a 3-wire coil, the tester measures the secondary peak voltage by monitoring the secondary voltage waveform which is collected from the magnetic pickup sensor. FIG. 14 shows a secondary voltage waveform used in testing a 3-wire coil. When performing the peak voltage test, the tester measures the peak voltage and compares the measured voltage with the specification of the coil. The peak voltage test results in a PASS status if the measured voltage value conforms with the specification, and a FAIL status if the measured voltage value does not conform with the specification.

Figure 15:
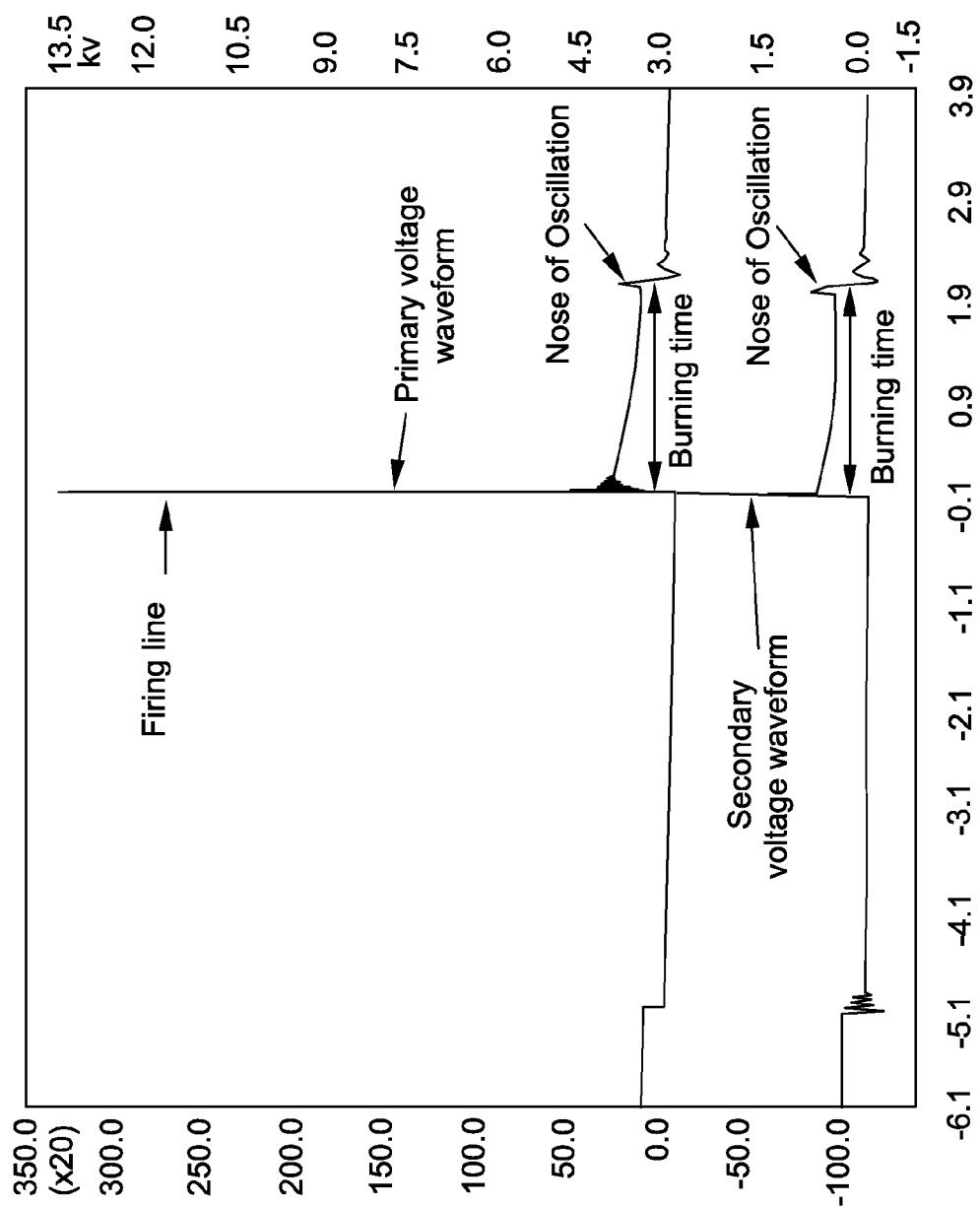
FIG. 15 is a graphical depiction of a primary circuit waveform and a secondary circuit waveform used in a burning time test.

The burning time represents the strength of the ignition coil 18 at the output (or high voltage output or secondary winding side) and is the time that is calculated from the occurrence of the spark to the dissipation on voltage waveform. Referring now, specifically to FIG. 15, the primary circuit waveform and the secondary circuit waveform of the ignition coil 18 have similar electrical characteristics by "mutual inductance" theory. Therefore, with a 2-wire coil, the burning time is measured from the "Firing Line" to the "Nose of Oscillation" of the primary voltage waveform. In the case of a 3-wire coil, the tester cannot access primary voltage, and thus, burning time is measured from the "Firing Line" to the "Nose of Oscillation" of the secondary voltage waveform received from the magnetic pickup sensor. The burning time test receives a PASS status if the time value meets the specifications and a FAIL status if the time value does not meet the specification.

Figure 16:
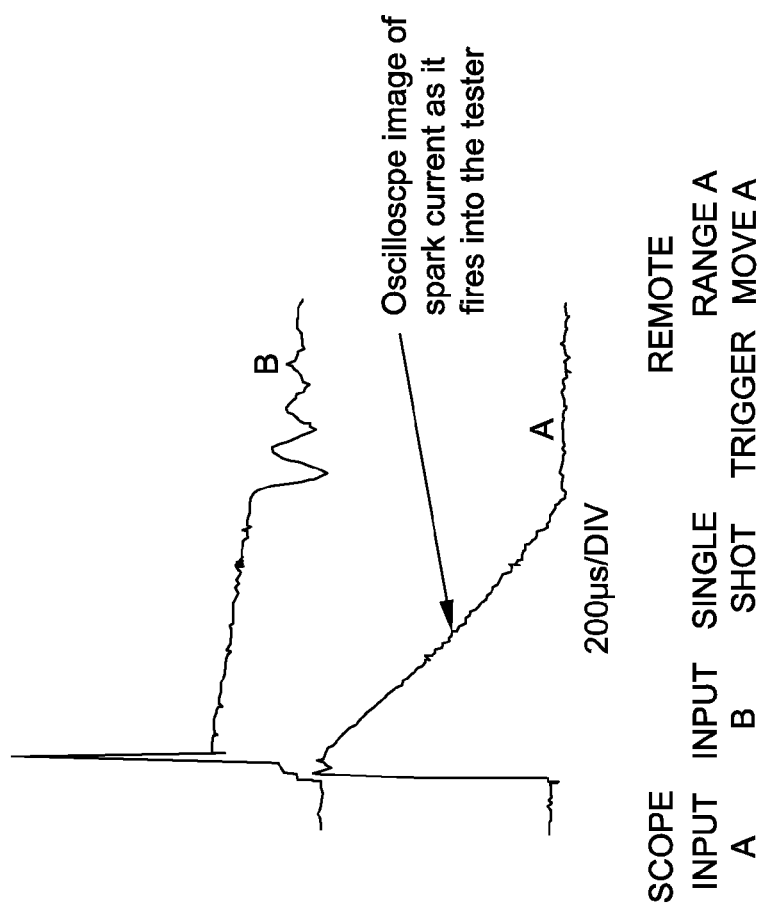
FIG. 16 is a graphical depiction of a burning time and spark current curve.
Figure 18:
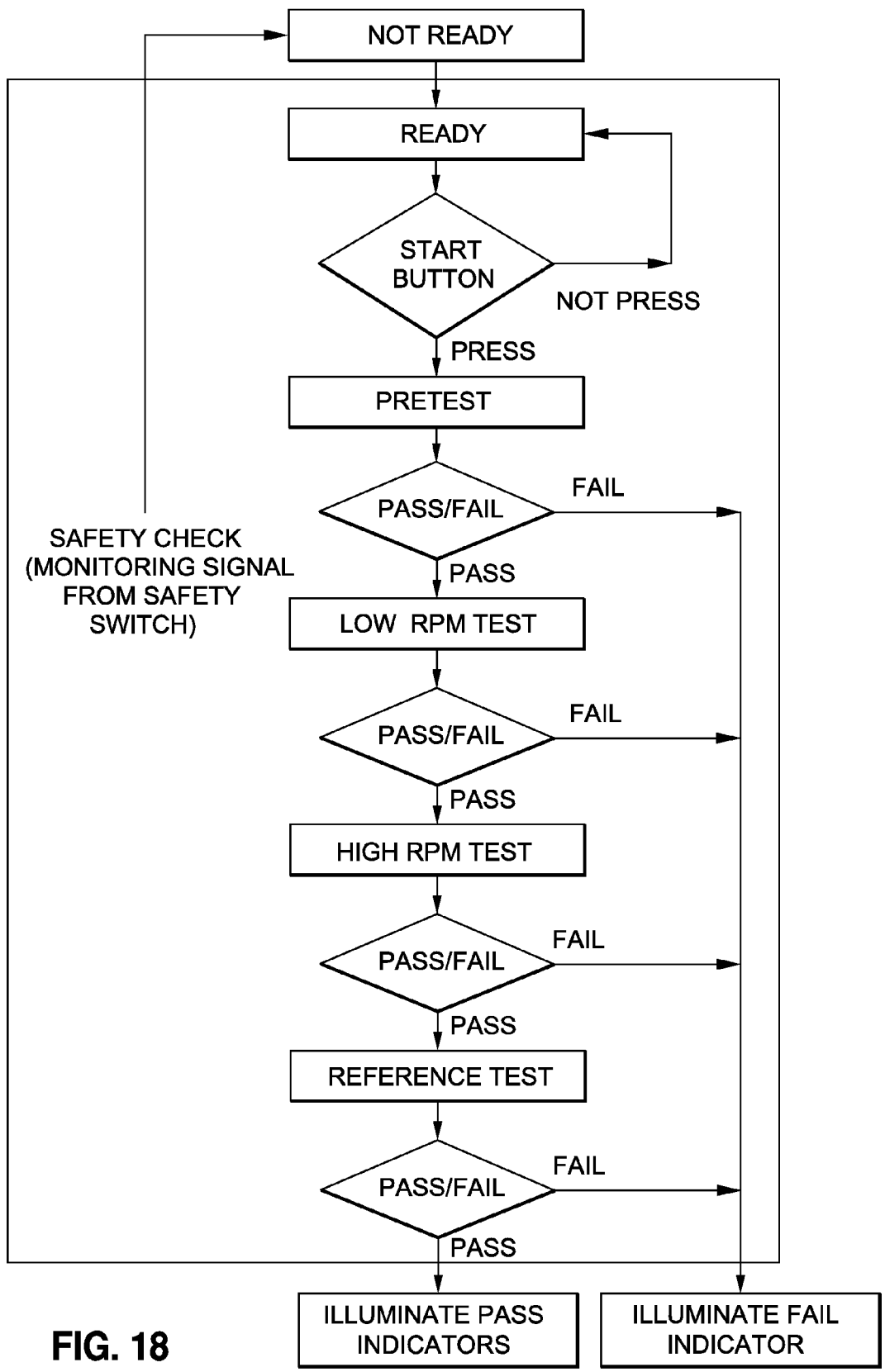
FIG. 18 is an ignition coil testing method in accordance with an embodiment of the present invention.

Turning now to the misfire test, a misfire refers to a miss spark occurring at the air gap. Referring now to FIG. 16, the tester 10 counts misfire by using a method which monitors spark current through the air-gap. The COP tester 10 can also monitor spark/secondary current, such that if a spark command is sent in the primary circuit, the tester 10 must receive one current signal. If not, the tester counts 1 for misfire value. The misfire test receives a PASS status if the misfire value is equivalent with zero and a FAIL status if the misfire test is larger than zero.

The reference test relates to testing the feedback signal. In particular, the tachometer signal is checked with E-coil-tachometer, an IGF signal is tested with Toyota-4-wire-coil, and a CSI signal is checked with a GM-coil-rail of GM's Compression Sense Ignition.

Figure 17:
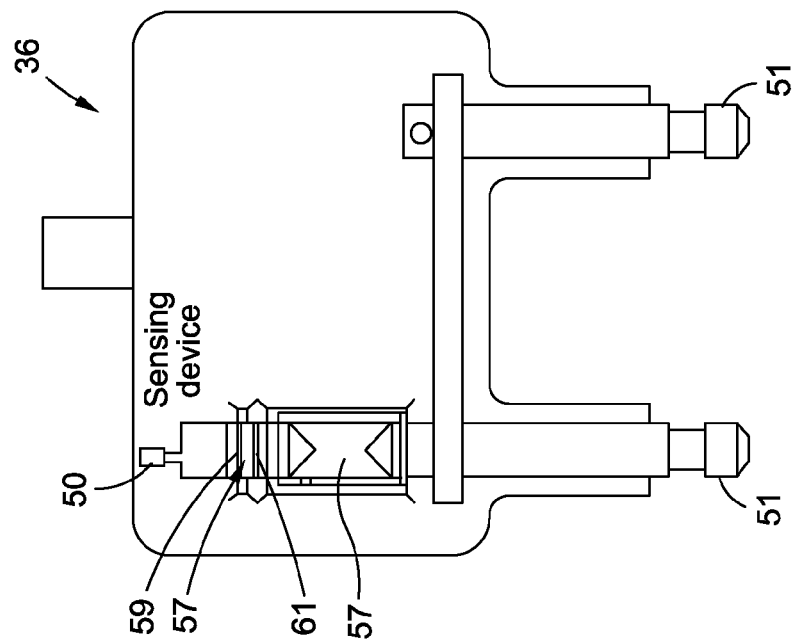
FIG. 17 is a schematic view of a sensing device.

Referring now to FIG. 17, another aspect of the tester 10 is to protect the user from shock by electrical spark. Along these lines, during normal operation of the vehicle, energy is supplied by the vehicle's battery. The ignition coil 18 is operative to increase battery voltage. In most cases, the sparking voltage is approximately 15,000 Volts+/−5000 Volts at normal operating conditions, and in some cases up to 40,000 Volts in abnormal conditions. When the sparking voltage is higher than the peak voltage level, an electric arc sparks from one pole to another pole. If the user forgets to plug in the secondary circuit connector 36 to the ignition coil 18, the electric spark will extend to the body of the coil, or potentially extend to the user. As such, there is a safety concern inherent with testing the operation of an ignition coil 18.

One embodiment of the tester 10 is designed to mitigate the safety concerns by performing continuous safety checks throughout the testing process. According to one embodiment, the tester 10 monitors the connection between the ignition coil's secondary circuit and the secondary circuit connector of the tester 10. The monitoring activity is performed by implementing an air gap 57 into the testing circuit, such that the distance from the coil 18 to the sensing device 50 is greater than the distance from the coil 18 to the air gap 57. An exemplary embodiment of the sensing device 50 is shown in FIG. 17. The secondary circuit connector 36 includes a pair of connector poles 51 which connect with the secondary circuit 38 of the ignition coil 18.

If the tester 10 is configured such that the distance from the coil 18 to the sensing device 50 is less than or equal to the distance from the coil 18 to the air gap 50, the electric spark will occur at the gap from the coil to the sensing device, instead of from one pole of the air gap to the other pole of the air gap. When the electric spark goes to the sensing device, the COP tester 10 will receive an electric shock, with the test result being pending, reset, run abnormally or damaged.

One implementation of the secondary circuit connector 36 includes a status indicator 57 integrated therein to indicate whether the sensing device 50 is ON or OFF. Along these lines, the status indicator 57 includes an ON identifier 59 (e.g., green LED) which illuminates when the sensing device 50 is ON, and an OFF identifier 61 (e.g., red LED) which illuminates when the sensing device 50 is OFF.

When the user plugs the secondary circuit connector 36 to the coil's secondary circuit 38, and the sensing device 50 is in the ready/ON status, the user presses a START button to start testing the coil 18. The COP tester 10 requires a signal from the safety switch and the START button to begin testing. Thus, if the sensing device 50 is not in a "ready" status, the test will be aborted.

As noted above, the COP tester 10 identifies the coil type by detecting the cable IDs, and selects the appropriate test procedure for the ignition coil 18 to be tested. If the ignition coil's secondary circuit 38 is unplugged from the tester's secondary circuit connector 36 for any reason, the signal from the safety switch is interrupted. The COP tester 10 immediately cuts the power supplied to the coil's primary circuit 42 and stops the test procedure. To protect the user from high voltage sparks generated by the coil's secondary circuit 38, a safety switch 55 is integrated into the secondary circuit connector 36. When the secondary circuit connector 36 is attached to the coil 18, the switch 55 sends an electronic signal to the COP tester 10. The tester 10 monitors this signal to allow the test to proceed.

When the user connects the adapter cable connector 34 to the control unit 12, the tester 10 electrically communicates with the coil 18 and creates a closed primary circuit and a closed secondary circuit, and the tester 10 is ready for testing the coil 18. If the primary circuit is open, the power is not supplied to the coil 18. The tester 10 may detect the opened primary circuit in Pretest mode, and set the Pretest result to FAIL. If the primary circuit is closed and the secondary circuit is open, the tester 10 detects the opened secondary circuit by monitoring the signal from the safety switch, and the COP tester 10 cuts the power supplied to the primary circuit, and reports the user to re-attach the secondary circuit connector 36 to the ignition coil 18.

When the tester 10 detects a closed primary circuit and a closed secondary circuit, the test procedure proceeds. While the COP tester 10 runs the test procedure corresponding to the specific ignition coil 18, the tester 10 continuously monitors the connection between the coil cable 16 and the ignition coil 18 to ensure safe testing conditions. In particular, the connection between the coil cable 16 and the ignition coil is continuously monitored before pretest, during pretest, during low RPM tests, during high RPM tests and during the reference test. When all tests have been completed, the tester initiates stopping procedures.

According to another aspect of the present invention, the tester 10 is specifically configured and adapted to reduce electromagnetic noise generated during spark emission. Along these lines, it is understood that electromagnetic noise levels may be related to the distance of the air-gap, the quality of the insulator's materials and the air-gap resistance.

Figure 19:
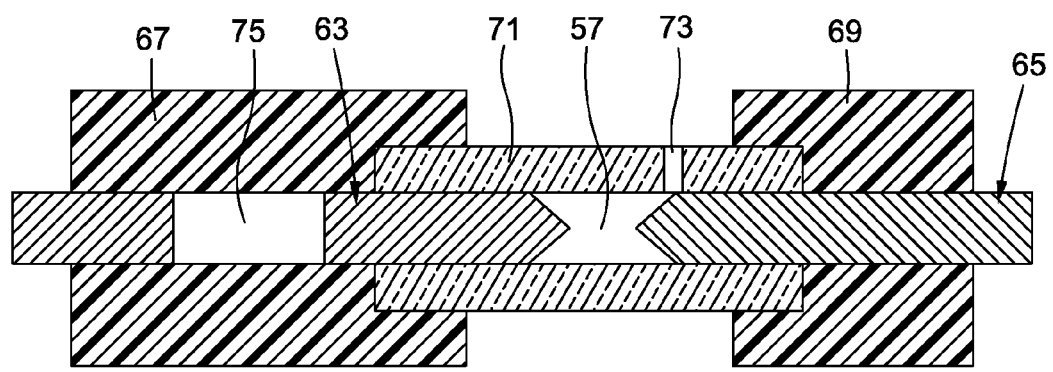
FIG. 19 is a schematic view of a resistor air-gap.

Referring now to FIG. 19, there is depicted a schematic drawing of an air gap 57 integrated into the secondary circuit connector 36. The air gap 57 extends between a first pole 63 which connects to the ignition coil 18 via the secondary connector 36, and a second pole 65 which connects to the control unit 12 via the intervening cables 14, 16. Separate cases 67, 69 are coupled to the respective poles 63, 65. The tips of the poles 63, 65 and the air gap 57 are located within a transparent wall 71, which may be made of glass or other transparent materials to allow the user to view the spark. An air gap hole 73 is formed within the transparent wall 71 and is in fluid communication with the air gap 57 and the ambient environment. In one implementation, a 5 kΩ-5

Watts resistor 75 is coupled to the pole 63 to mitigate or prevent electromagnetic noise.

Additional modifications and improvements of the present invention may also be apparent to those of ordinary skill in the art. Thus, the particular combination of components and steps described and illustrated herein is intended to represent only certain embodiments of the present invention, and is not intended to serve as limitations of alternative devices and methods within the spirit and scope of the invention.

What is claimed is:

1. An ignition coil tester for testing an ignition coil having a primary circuit and a secondary circuit, the ignition coil tester comprising: a cable connector including:
   a primary circuit connector electrically connectable to the primary circuit of the ignition coil; and
   a secondary circuit connector electrically connectable to the secondary circuit of the ignition coil; and
   an electronic ignition control module electrically coupled to the primary circuit connector and the secondary circuit connector, wherein the electronic ignition control module is configured to:
   generate ignition coil testing signals for communication to the ignition coil via the primary circuit connector and the secondary circuit connector;
   monitor either or both of a first connection between the primary circuit connector and the primary circuit of the ignition coil and a second connection between the secondary circuit connector and the secondary circuit of the ignition coil; and
   cease communication of the ignition coil testing signals when the primary circuit connector or the secondary circuit connector are not connected to the respective ones of the primary circuit and the secondary circuit of the ignition coil; wherein the primary circuit connector and the secondary circuit connector collectively define a unique connector ID; and
   wherein the electronic ignition control module is configured to generate the ignition coil testing signals dependent upon the unique connector ID.

2. The ignition coil tester recited in claim 1, wherein the cable connector includes an air gap.

3. The ignition coil tester recited in claim 2, further comprising a resistor operatively associated with the air gap.

4. The ignition coil tester recited in claim 1, further comprising a magnetic pickup sensor configured to collect a signal from a trigger ignition coil.

5. The ignition coil tester recited in claim 1, further comprising a power supply in electrical communication with the electronic ignition control module.

6. The ignition coil tester recited in claim 1, wherein the electronic ignition control module is configured to generate ignition coil testing signals associated with multiple RPM speeds.

7. The ignition coil tester recited in claim 1, wherein the ignition coil testing signals are adapted to test current leakage.

8. The ignition coil tester recited in claim 1, wherein the ignition coil testing signals are adapted to test winding resistance.

9. A method of testing an ignition coil having a primary circuit and a secondary circuit, the method comprising the steps of:
   generating ignition coil testing signals for communication to the ignition coil;
   communicating the ignition coil test signals to the ignition coil, wherein a primary circuit connector communicates the ignition coil test signals to the primary circuit and a secondary circuit connector communicates the ignition coil test signals to the secondary circuit;
   monitoring either or both of a first connection between the primary circuit connector and the primary circuit of the ignition coil and a second connection between the secondary circuit connector and the secondary circuit of the ignition coil; and
   ceasing communication of the ignition coil testing signals when the primary circuit connector or the secondary circuit connector are not connected to the respective ones of the primary circuit and the secondary circuit of the ignition coil;
   wherein the primary circuit connector and the secondary circuit connector collectively define a unique connector ID, the ignition coil testing signals generated being dependent upon the unique connector ID.

10. The method recited in claim 9, wherein the step of generating ignition coil testing signals includes generating testing signals for testing ignition coil performance at multiple speeds.

11. The method recited in claim 9, wherein the step of generating ignition coil testing signals includes generating testing signals for testing current leakage of the ignition coil.

12. The method recited in claim 9, wherein the step of generating ignition coil testing signals includes generating testing signals for testing winding resistance of the ignition coil.

* * * * *